United States Patent
O'Brien et al.

(10) Patent No.: US 7,119,019 B2
(45) Date of Patent: Oct. 10, 2006

(54) CAPPING OF COPPER STRUCTURES IN HYDROPHOBIC ILD USING AQUEOUS ELECTRO-LESS BATH

(75) Inventors: Kevin P. O'Brien, Portland, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/814,592

(22) Filed: Mar. 31, 2004

(65) Prior Publication Data

US 2005/0227488 A1    Oct. 13, 2005

(51) Int. Cl.
  *H01L 21/44*  (2006.01)
  *H01L 21/31*  (2006.01)
  *H01L 21/469*  (2006.01)

(52) U.S. Cl. ............... 438/687; 438/763; 438/778

(58) Field of Classification Search ......... 438/678, 438/758, 676, 687, 763, 778
See application file for complete search history.

(56) References Cited

U.S. PATENT DOCUMENTS

| | | | |
|---|---|---|---|
| 5,310,602 A | 5/1994 | Li et al. | |
| 5,447,599 A | 9/1995 | Li et al. | |
| 5,447,887 A | 9/1995 | Filipiak et al. | |
| 5,545,927 A | 8/1996 | Farooq et al. | |
| 5,549,808 A | 8/1996 | Farooq et al. | |
| 5,705,857 A | 1/1998 | Farooq et al. | |
| 5,898,222 A | 4/1999 | Farooq et al. | |
| 6,165,894 A | 12/2000 | Pramanick et al. | |
| 6,165,912 A * | 12/2000 | McConnell et al. | 438/758 |
| 6,323,135 B1 | 11/2001 | Ngo et al. | |
| 6,368,948 B1 | 4/2002 | Ngo et al. | |
| 6,492,266 B1 | 12/2002 | Ngo et al. | |
| 6,506,677 B1 | 1/2003 | Avanzino et al. | |
| 6,537,913 B1 | 3/2003 | Modak | |
| 6,599,827 B1 | 7/2003 | Ngo et al. | |
| 6,660,634 B1 | 12/2003 | Ngo et al. | |
| 6,777,807 B1 * | 8/2004 | Sukharev et al. | 257/751 |
| 2006/0003570 A1 * | 1/2006 | Shanmugasundram et al. | 438/618 |

* cited by examiner

*Primary Examiner*—Ngân V. Ngô
(74) *Attorney, Agent, or Firm*—Schwabe, Williamson & Wyatt, P.C.

(57) ABSTRACT

Capping of copper structures in hydrophobic interlayer dielectric layer, using aqueous electro-less bath is described herein.

11 Claims, 3 Drawing Sheets

US 7,119,019 B2

CAPPING OF COPPER STRUCTURES IN HYDROPHOBIC ILD USING AQUEOUS ELECTRO-LESS BATH

TECHNICAL FIELD & BACKGROUND

The present invention is related to the field of integrated circuits. More specifically, the present invention is related to the formation of cobalt caps on copper interconnects.

Recently, there is increasing interest in the semiconductor industry to reduce the defects on copper interconnects and properly add a cobalt capping layer to each of the copper interconnects. One area of difficulty preventing the accomplishment of low or no defects and even deposition of a cobalt capping layer on each of the copper interconnects is the cobalt wetting problem. The cobalt wetting problem involves the difficulty of electro-less cobalt solutions evenly wetting the top surface of each of the copper interconnects. Also the wetting problem increases the amount of cobalt particles that get adhered to undesired areas on the wafer.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a component having the formation of cobalt caps on copper interconnects, method for making such component, and system having such component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
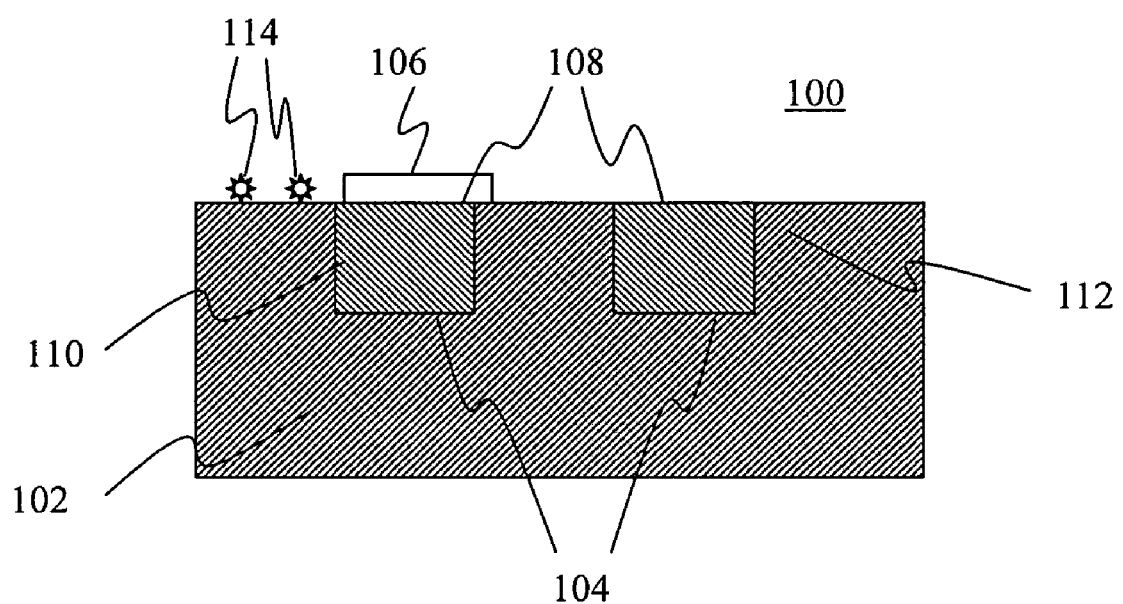
FIG. 1 illustrates a cross sectional view of a portion of a component showing a cobalt capping layer and little or no cobalt particles on the interlayer dielectric layer, in accordance with one embodiment.

Referring now to FIG. 1, wherein a cross sectional view of a portion of a component showing a cobalt capping layer and little or no cobalt particles on the interlayer dielectric layer, in accordance with one embodiment. As illustrated, for the embodiment, wafer 100 includes an interlayer dielectric layer 102 and a number of copper structures 104 disposed on the interlayer dielectric layer 102. Shown in FIG. 1 is a cobalt barrier layer 106 disposed on a top surface 108 of one of the copper structures 104. Copper structure 104 with cobalt barrier layer 106 may also be referred to as copper structure with capping layer 110 and copper structure without cobalt barrier layer 106 may be referred to as a copper structure without a capping layer 112 as shown.

In various embodiments, the interlayer dielectric layer (ILD) 102 is a partially or fully hydrophobic low K ILD. That is, ILD 102 is of a type that is adverse to an aqueous (water) based solution, resulting in higher surface tension adverse to the aqueous based solution, which in turn may lead to the uneven wetting of the top surface of the partially or fully hydrophobic low K ILD. An example of a hydrophobic low K ILD is a low K Si—O ILD having methyl content. In various embodiments, the low K dielectric constant value is 3.5 or lower.

As will be described in more detail below, the cobalt barrier layer 106 is deposited on the top surface 108 using an aqueous cobalt electro-less bath assisted by sonic energy to reduce the surface tension, contributing to the interlayer dielectric layer 102 having lower or substantially free of adhered cobalt particles 114. Substantially free is with little or no cobalt particles 114 on the interlayer dielectric layer 102. The sonic energy aids in the thorough and homogeneous deposition of cobalt onto the top surface 108. The sonic energy also reduces the surface tension for the electro-less solution, increasing the wettability of the top surface 108.

In various embodiments, the interlayer dielectric layer 102 may have lower or substantially free of adhered particles 114 due to further simultaneous rinsing and applying of sonic energy to the interlayer dielectric layer 102 together, after deposition of the cobalt barrier layer 106.

The sonic energy, whether it is applied during deposition or rinsing may be a selected one of mega and ultra sonic energy. The sonic energy may be in a frequency range of 10 to 1200 kiloHertz and power in the range of 1 to 5 Watts/cm$^2$. The sonic energy may be applied during a portion or the entire duration of deposition/rinsing.

In various embodiments, the sonic energy applied during deposition and rinsing may be of the same or different type, same or different frequency, as well as same or different power.

Figure 2A:
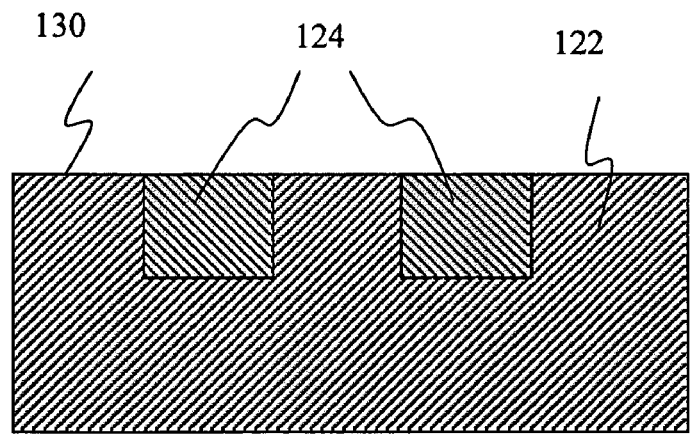
FIGS. 2a–2b illustrate a method for making the wafer of FIG. 1, in accordance with one embodiment.
Figure 2B:
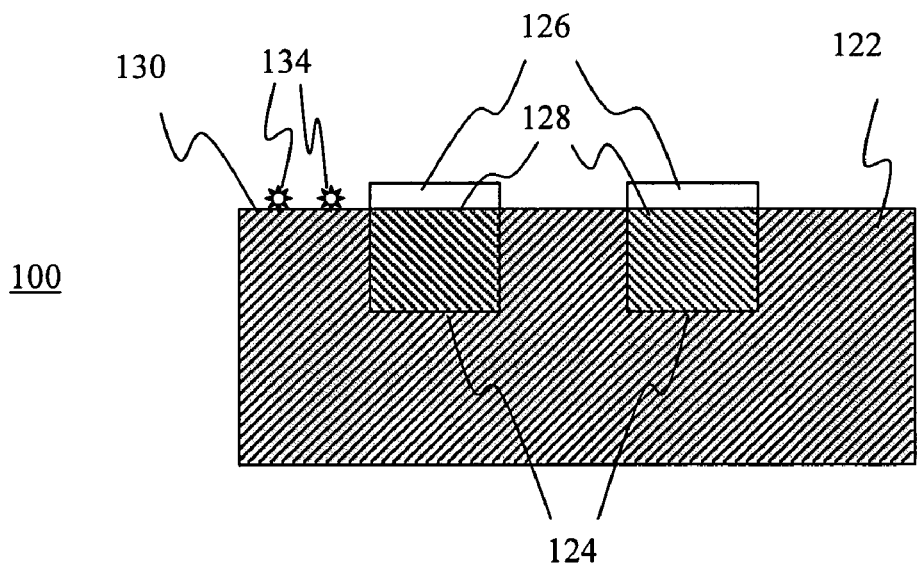

FIGS. 2a–2b illustrate a method of making wafer 100 in accordance with one embodiment. The embodiment wafer 100 has a hydrophobic interlayer dielectric layer 122 (hereinafter, simply interlayer dielectric layer) and a plurality of copper structures 124 partially encased in an interlayer dielectric layer 122. Top surfaces 128 of the copper structures 124 are exposed and substantially co-planar with a top surface of the interlayer dielectric layer 130. A cobalt barrier layer 126 is selectively deposited on the top surface of the plurality of copper structures 124, using an aqueous electroless cobalt bath, assisted by application of the sonic energy. By applying sonic energy during deposition, substantially less, or possibly no deposition of cobalt 134 on the top surface of the interlayer dielectric layer 130 may be effectuated.

In various embodiments, the interlayer dielectric layer 122 may also have sonic energy simultaneously applied while the top surface is being rinsed after deposition. The combined simultaneous rinse and application of sonic energy, after deposition, may further contribute to the decrease of the amount of cobalt particles adhered to the interlayer dielectric layer 122.

As described earlier, the sonic energy may be applied for a portion or the entire duration of the deposition/rinsing. The sonic energy may be a selected one of mega and ultra sonic energy, of a selected frequency between 10 and 1200 Hertz, and of a power level between 1 and 5 Watts/cm$^2$.

Figure 3:
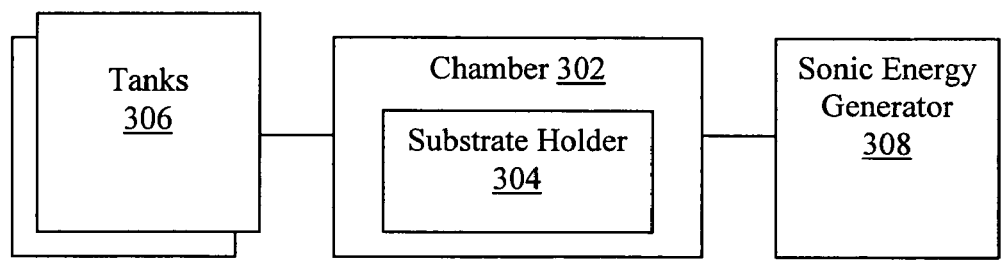
FIG. 3 illustrates a block diagram view of a system for making the wafer of FIG. 1, in accordance with one embodiment.

FIG. 3 illustrates a block diagram view of a system suitable for use to practice the sonic energy augmented process for forming cobalt caps on copper structures disposed on a hydrophobic interlayer dielectric layer, in accordance with one embodiment. As illustrated, system 300 includes chamber 302 adapted for cobalt deposition to form the cobalt capping on copper structures disposed on a hydrophobic interlayer dielectric layer. Chamber 302 includes a substrate holder 304 for holding the substrate with the hydrophobic interlayer dielectric layer having copper structures to be cobalt capped.

Additionally, for the embodiment, system 300 includes sonic energy generator 308 coupled to chamber 302 to allow sonic energy to be generated and provided to chamber 302 during the cobalt deposition process, as earlier described.

Further, for the embodiment, system 300 includes one or more tanks coupled to chamber 302 to store and provide chamber 302 with an aqueous electro-less solution for the rinsing operation earlier described. For the embodiment, sonic generator 308 is also adapted to allow sonic energy to be generated and provided to chamber 302 during the rinsing process, as earlier described.

Except for the novel employment of sonic energy generator 308 to generate and provide sonic energy to augment the cobalt deposition and/or the rinsing process, chamber 302, tanks 306 and sonic energy generator 308 may be implemented in any one of a variety of manners.

Figure 4:
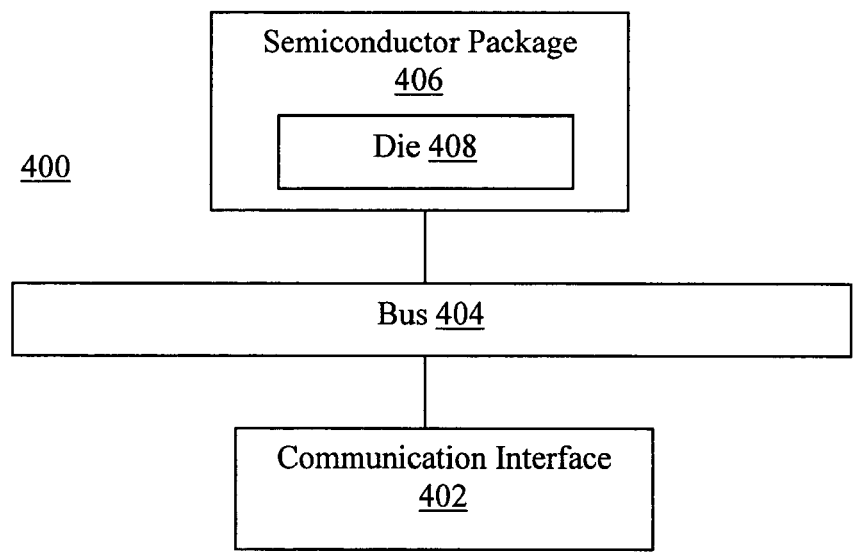
FIG. 4 illustrates a block diagram view of a system having the wafer of FIG. 1 in accordance with one embodiment.

FIG. 4 illustrates a block diagram view of a system having a semiconductor package with a die having copper structures cobalt capped as earlier described, in accordance with one embodiment. As illustrated, for the embodiment, system 400 includes a communication interface 402 coupled to a bus 404. The bus 404 is coupled to the semiconductor package 406 and the semiconductor package 406 comprises a die 408. The die 408 has a hydrophobic interlayer dielectric layer and a plurality of copper structures disposed thereon. Further, a cobalt barrier layer is deposited on a top surface of each of the plurality of copper structures, as earlier described. The interlayer dielectric layer has a decreased amount of cobalt deposition that may be effectuated by augmenting the cobalt deposition process, and/or the post-deposition rinsing process, with sonic energy, as earlier described with reference to FIG. 2.

In various embodiments, semiconductor package 406 may be a microprocessor, a memory device, a graphics processor, a crypto processor, digital signal processor, or other semiconductor devices of the like.

In various embodiments, system 400 may be a wireless mobile phone, a personal digital assistant, a tablet computer, a laptop computer, a desktop computer, a server, a digital camera, a digital versatile disk player, an audio/video media play, or a set-top box. Communication interface 402 may be a networking interface.

Thus, it can be seen from the above descriptions, a novel component having the formation of cobalt caps on copper interconnects, method for making such a component, and a system having such a component have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. A method comprising:
   providing a wafer comprising a plurality of copper structures partially encased in a hydrophobic interlayer dielectric layer, wherein top surfaces of the copper structures are exposed and substantially co-planar with a top surface of the hydrophobic interlayer dielectric layer; and
   selectively depositing a cobalt capping layer on the top surfaces of the plurality of copper structures with substantially no deposition of the cobalt on the top surface of the hydrophobic interlayer dielectric layer, using an aqueous electro-less bath; and
   applying sonic energy to the aqueous electro-less bath during said selective deposition.

2. The method of claim 1, wherein the applying of sonic energy comprises applying a selected one of mega and ultra sonic energy.

3. The method of claim 1, wherein the applying of sonic energy comprises applying the sonic energy at a frequency range of 10 to 1200 kilohertz.

4. The method of claim 1, wherein the applying of sonic energy comprises applying the sonic energy at a power level in a range of 1 to 5 watts/cm$^2$.

5. The method of claim 1, wherein the method further comprises simultaneously rinsing and applying sonic energy to the hydrophobic interlayer dielectric layer after said selective deposition of cobalt.

6. A method comprising:
   providing a wafer comprising a plurality of copper structures partially encased in a hydrophobic interlayer dielectric layer, wherein top surfaces of the copper structures are exposed and substantially co-planar with a top surface of the hydrophobic interlayer dielectric layer;
   selectively depositing a cobalt capping layer on the top surfaces of the plurality of copper structures; and
   simultaneously rinsing and applying sonic energy to the hydrophobic interlayer dielectric layer to decrease the amount of cobalt particles adhered to the hydrophobic interlayer dielectric layer.

7. The method of claim 6, wherein the applying of sonic energy comprises applying a selected one of mega and ultra sonic energy.

8. The method of claim 6, wherein the applying of sonic energy comprises applying the sonic energy at a frequency range of 10 to 1200 kilohertz.

9. The method of claim 6, wherein the applying of sonic energy comprises applying the sonic energy at a power level in a range of 1 to 5 watts/cm$^2$.

10. A method comprising:

providing a wafer comprising a plurality of copper structures partially encased in a hydrophobic interlayer dielectric layer, wherein top surfaces of the copper structures are exposed and substantially co-planar with a top surface of the hydrophobic interlayer dielectric layer;

selectively depositing a cobalt capping layer on the top surfaces of the plurality of copper structures with substantially no deposition of cobalt on the top surface of the hydrophobic interlayer dielectric layer, using an aqueous electro-less bath; and reducing surface tension of the aqueous electro-less bath during deposition of the cobalt capping layer to increase wettability of the top surfaces of the plurality of the copper structures.

11. The method of claim 10, wherein the reducing of the surface tension of the aqueous electro-less bath comprises applying sonic energy.

* * * * *